United States Patent [19]

Misaizu

[11] 4,395,644
[45] Jul. 26, 1983

[54] DRIVE CIRCUIT

[75] Inventor: Tetsuo Misaizu, Tokyo, Japan

[73] Assignee: Nippon Electric Co., Ltd., Tokyo, Japan

[21] Appl. No.: 177,552

[22] Filed: Aug. 13, 1980

[30] Foreign Application Priority Data

Aug. 15, 1979 [JP] Japan .................................. 54-104230
May 26, 1980 [JP] Japan .................................. 55-69745

[51] Int. Cl.$^3$ ............................................. H03K 5/01
[52] U.S. Cl. .................................... 307/270; 307/264;
307/482; 307/578
[58] Field of Search ................ 307/264, 482, 578, 270

[56] References Cited

U.S. PATENT DOCUMENTS 3,769,528 10/1973 Chu et al. .............................. 307/578
4,071,783 1/1978 Knepper .............................. 307/482
4,276,487 6/1981 Arzubi et al. ........................ 307/482

Primary Examiner—John Zazworsky
Attorney, Agent, or Firm—Sughrue, Mion, Zinn, Macpeak & Seas

[57] ABSTRACT

A boot strap type circuit which can raise an output potential up to a power supply voltage irrespective of a condition of an input signal is disclosed. The circuit is characterized by comprising a series circuit coupled between a first end of a capacitor, from which end a boot strapped voltage is derived, and a reference voltage, the series circuit being responsive to transition of the input signal for pulling down a potential at the first end of the capacitor after a predetermined delay from that transition.

26 Claims, 13 Drawing Figures

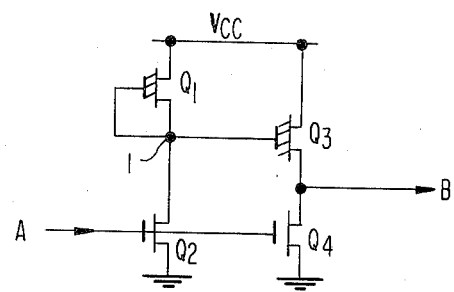
FIG. 1
PRIOR ART
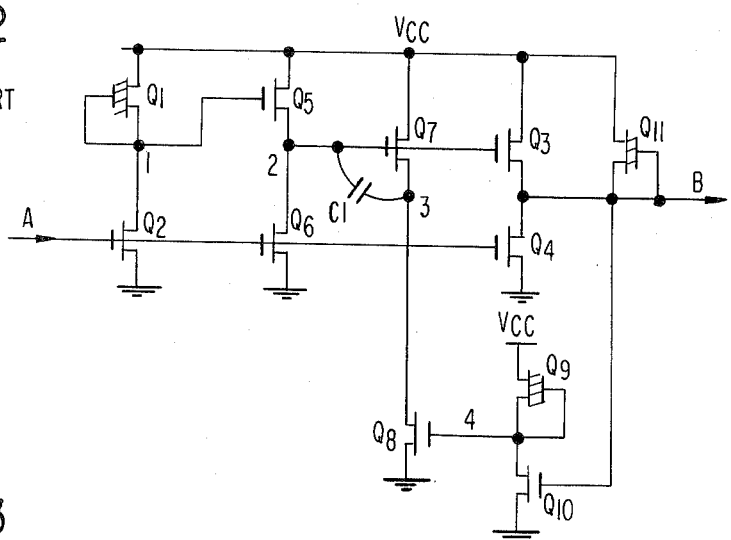
FIG. 2
PRIOR ART
FIG. 3
PRIOR ART
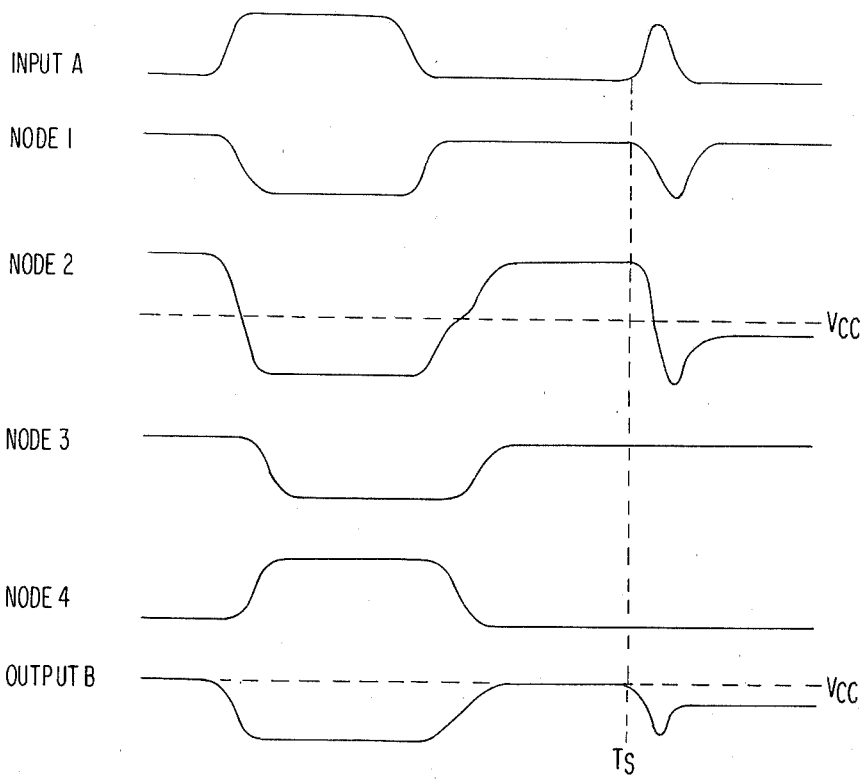

DRIVE CIRCUIT

BACKGROUND OF THE INVENTION

The present invention relates to a driver circuit employing insulated gate field effect transistors (hereinafter abbreviated as IGFETs), and more particularly to a boot strap type driver circuit for a large capacity load which raises an output up to a power supply voltage.

As a circuit for providing a high level output equal to a power supply ($V_{CC}$) level, a circuit employing a depletion type IGFET as a load of an output stage inverter has been known. Such type of circuits basically achieve a static operation and are not subjected to any restriction for timing of input signals. However, when the output is at a low level, the current flowing through the load was so large that they were not favorable in view of electric power consumption.

A so-called boot strap circuit has improved this shortcoming, and it can produce an output at a high level equal to a power supply lever despite its low power consumption. One example of the boot strap circuit is described in U.S. Pat. No. 3,898,479. In the boot strap circuit, the boot strap effect is achieved by controlling a charge operation of a boot strap capacitor over a delay time. Accordingly, the boot strap circuit cannot achieve the boot strap effect for every input waveform. In particular, when an input signal for providing a high level output is applied to the circuit employing N-channel IGFETs in succession to an input signal having a minute pulse width for providing a low level output, the electric charge stored in the boot strap capacitor is once discharged, and thereafter a sufficient charging period cannot be assured, so that the boot strap capacitor cannot be fully charged up and thus a sufficient boot strap effect is not achieved.

The above-described shortcoming that the output cannot always be held at a fixed level for any input condition, is a fatal defect for a circuit of high speed operation, especially for a circuit of static operation.

SUMMARY OF THE INVENTION

It is one object of the present invention to provide a driver circuit in which an output can be raised up to a power supply level irrespective of an input condition.

It is another object of the present invention to provide a driver circuit which can drive a large-capacity load with a small power consumption.

A circuit according to the present invention comprises a first insulated gate field effect transistor, a drain node of the first transistor being connectable to a drain voltage, a second insulating gate field effect transistor, a source node of the first transistor and a drain node of the second transistor being electrically common, the source node of the second transistor being connectable to a source voltage, a gate node of the first transistor being capacitively coupled to the source node thereof by a capacitance, a signal node, and a control circuit responsive to signal levels at the signal node for making the first transistor and the second transistor conducting and non-conducting in order, respectively, thereby producing a voltage larger than the drain voltage in absolute value at the gate node of the first transistor, the control circuit including a third insulated gate field effect transistor, a drain of the third transistor being connected to the gate node of the first transistor, a fourth insulated gate field effect transistor having a drain coupled to a source of the third transistor and a source connectable to the source voltage, a fifth insulated gate field effect transistor having a source coupled to the gate node of the first transistor and a drain connectable to the drain voltage, first means responsive to the signal levels at the signal node for making the fifth transistor conducting for a first level at the signal node and non-conducting for a second level at the signal node, second means responsive to a second level at the signal node for making the fourth transistor conducting, and third means for operatively making the third transistor conducting after the fourth transistor is turned to conducting.

A circuit according to another aspect of the present invention comprises a first node, a second node, a first transistor, first connection means for coupling a gate of the first transistor to the first node, a second connection means for coupling a source of said first transistor to the second node, capacitor means, third connection means for coupling one end of the capacitor means to the first node, fourth connection means for coupling the other end of the capacitor means to the second node, switching means responsive to a first level of an input signal for substantially changing a potential at the second node to a reference voltage, and control means in response to the first level of the input signal for substantially changing a potential at the first node to the reference voltage with a predetermined delay from the time point when the second node is changed to the reference voltage by the switching means.

According to one feature of the present invention, there is provided a driver circuit, where output is raised up to a power supply voltage by pulling up a gate potential of an output stage transistor higher than the power supply voltage by making use of a boot strap effect derived from one end of a capacitor, and which comprises a first IGFET having its gate terminal connected directly to an input terminal and connected between the other end of said capacitor and a reference voltage source, and a series circuit of second and third IGFET's connected between the one end of the capacitor and the reference voltage source, whereby a potential deop at said one end of the capacitor can be suppressed by the series circuit.

According to another feature of the present invention, there is provided a driver circuit for a large capacity load, where output is raised up to a power supply voltage by pulling up a gate potential of an output stage transistor higher than the power supply voltage by making use of a boot voltage derived from one end of a capacitor, and which comprises a circuitry including a first IGFET having its gate terminal connected to an input terminal and connected between the other end of the capacitor and a reference voltage source, second and thid IGFET's having their gate terminals connected to the input terminal and connected in series between the one end of the capacitor, that is, the gate terminal of the output stage transistor and the reference voltage source, and a fourth IGFET connected between an intermediate node between the second and third IGFET's and a power supply terminal, whereby when a minute pulse signal is applied to the input terminal, the potential at the other end of the capacitor can be made easy to be pulled down, and the gate potential of the output stage transistor can be made hard to be pulled down, so that the boot strap effect may be realized effectively.

According to still another feature of the present invention, there is provided a driver circuit for a large capacitive load, where the output is raised up to a power supply voltage by pulling up a gate potential of an output stage transistor higher than the power supply voltage by making use of a boot strap effect derived from one end of a capacitor, and which comprises a circuitry including a first IGFET having its gate terminal connected to an input terminal and connected between one end of the capacitor and a ground potential, a second IGFET having its gate terminal connected to a signal terminal for providing a signal that is in phase with an input signal and is delayed by a predetermined delay time with respect to the input signal, and a third IGFET having its gate terminal connected to the input terminal and connected in series with the second IGFET between the gate terminal of the output stage transistor and a reference voltage source, whereby when a minute pulse signal is applied to the input terminal, the potential at the other end of the capacitor can be made easy to be pulled down, and the gate potential of the output stage transistor can be made hard to be pulled down, so that the boot strap effect may be realized effectively.

According to yet another feature of the present invention, there is provided the above-featured driver circuit, which further comprises a fifth IGFET having its gate terminal connected to a signal terminal for providing a signal that is in opposite phase to an input signal and is delayed by a predetermined delay time with respect to the input signal and connected between a power supply terminal and a gate terminal of an output stage transistor, whereby when the boot strapped output is pulled down, the fifth IGFET tends to transiently hold the gate potential of the output stage transistor at a potential that is lower than the power supply voltage by a threshold voltage of one stage of IGFET, so that the boot strap effect may be realized effectively.

According to a further feature of the present invention, there is provided a driver circuit where output is raised up to a power supply voltage by pulling up a gate potential of an output stage transistor higher than the power supply voltage by making use of a boot strapped voltage derived from one end of a capacitor, and which comprises a first transistor having its gate terminal connected to an input terminal, its drain terminal connected to the other end of the capacitor and its source terminal connected to a first reference voltage source, second and third transistors connected in series between the one end of the capacitor and the first reference voltage source, and a fourth transistor having to drain terminal connected to a second reference voltage source and its source terminal connected in common to the junction terminal between the second and third transistors.

The circuit of this invention is highly useful as a driver circuit such as a word line driver in a memory device, or as a delay stage or an inverter stage in variety of MOS integrated circuits.

BRIEF DESCRIPTION OF THE INVENTION

The above-mentioned and other features and objects of the present invention will become more apparent by reference to the following description of its preferred embodiments taken in conjunction with the accompanying drawings, wherein:

FIG. 1 is a circuit diagram showing a driver circuit in the prior art,

FIG. 2 is a circuit diagram showing a somewhat improved driver circuit known in the prior art, FIG. 3 is a waveform diagram showing operation waveforms appearing at the input and output terminals and at various nodes in the heretofore known circuit in FIG. 2, FIG. 4 is a circuit diagram showing a driver circuit according to a first preferred embodiment of the present invention, FIG. 5 is a circuit diagram showing a driver circuit according to a second preferred embodiment of the present invention, FIG. 6 is a waveform diagram showing operation waveforms appearing at the input and output terminals and at various nodes in the circuit shown in FIG. 4, FIG. 7 is a circuit diagram showing a driver circuit according to a third preferred embodiment of the present invention, FIG. 8 is a circuit diagram showing a driver circuit according to a fourth preferred embodiment of the present invention, FIG. 9 is a circuit diagram showing a driver circuit according to a fifth preferred embodiment of the present invention, FIG. 10 is a circuit diagram showing a driver circuit according to a sixth preferred embodiment of the present invention, FIG. 11 is a circuit diagram showing a driver circuit according to a seventh preferred embodiment of the present invention, FIG. 12 is a circuit diagram showing a driver circuit according to a eighth preferred embodiment of the present invention, and FIG. 13 is a circuit diagram showing a driver circuit according to a nineth preferred embodiment of the present invention.

DESCRIPTION OF THE PRIOR ART

Heretofore, as a driver circuit for a large capacity load which raises an output up to a power supply voltage, circuits having the constructions shown in FIGS. 1 and 2 have been known.

Throughout the following description, among IGFETs, the most representative MOS transistors are employed. Especially, the description is made with respect to N-channel MOS transistors.

In FIG. 1, a driver circuit is composed of IGFET's $Q_1$, $Q_2$, $Q_3$ and $Q_4$, in which the IGFET's $Q_1$ and $Q_3$ are depletion type MOS transistors, while the IGFET's $Q_2$ and $Q_4$ are enhancement type MOS transistors.

The transistors $Q_1$ and $Q_2$ form an inverter circuit, in which in order to hold a node 1 at a low level when an input A is at a high potential, the transistors $Q_1$ and $Q_2$ are necessitated to have a predetermined dimension ratio. The transistors $Q_3$ and $Q_4$ form a buffer circuit, and since the transistor $Q_3$ is a depletion type MOS transistor, in order to hold an output B at a low potential the transistors $Q_3$ and $Q_4$ are also necessitated to have a predetermined dimension ratio.

Such type of circuits had a shortcoming that the current flowing through the transistor $Q_3$ could not be neglected, that is, a waste current was large.

A circuit which has improved the aforementioned shortcoming is the circuit shown in FIG. 2 which employs a boot strap structure.

In FIG. 2, a driver circuit is composed of MOS transistors $Q_1$ to $Q_{11}$, of which the transistors $Q_1$, $Q_9$ and $Q_{11}$ are depletion type MOS transistors, while the transistors $Q_2$, $Q_3$, $Q_4$, $Q_5$, $Q_6$, $Q_7$, $Q_8$ and $Q_{10}$ are enhancement type transistors. In this circuit arrangement, the respective transistor pairs consisting of the transistors $Q_1$ and $Q_2$, $Q_7$ and $Q_8$, and $Q_9$ and $Q_{10}$, respectively, form inverter circuits, and each of these transistor pairs is necessitated to have a predetermined dimension ratio. The transistors $Q_5$ and $Q_6$ form an intermediate buffer circuit, and the transistors $Q_3$ and $Q_4$ form an output buffer circuit. Each of the transistors $Q_3$, $Q_4$, $Q_5$ and $Q_6$ is not necessitated to have a special dimension ratio. The transistor $Q_{11}$ is a leakage compensation transistor for maintaining the power supply level at the output. The operation waveforms appearing at various points in the circuit shown in FIG. 2, are illustrated in FIG. 3.

The above-mentioned type of circuits have a shortcoming that when a pulse having a very short width is applied to the input A, the output B is hardly raised up to the power supply level as shown in FIG. 3. More particularly, when a pulse having a very short width is applied to the input A at a time point Ts, the levels at the nodes 1 and 2 and at the output B are pulled down. However, if the fall of the level at the output B is insufficient, the level at the node 4 does not rise, that is, the transistor $Q_8$ is not turned ON. Hence, the level at the node 3 does not fall. In other words, a charge of the boot strap capacitor C1 cannot be fully achieved in this case. Accordingly, since the boot strap effect is not effective, the level at the output B cannot be pulled up promptly to the power supply level ($V_{CC}$).

DETAILED DESCRIPTION OF THE PREFERRED EMBODIMENTS

Now the present invention will be described in greater detail with reference to FIGS. 4 through 13.

Figure 4:
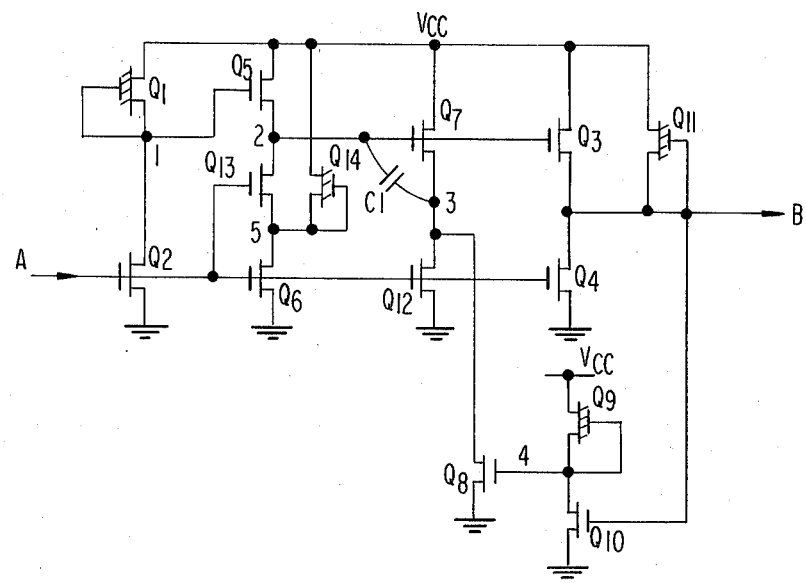

With reference to FIG. 4, a driver circuit according to a first preferred embodiment of the present invention will be described. This circuit includes MOS transistors $Q_1$ to $Q_{14}$ and a boot capacitor C1. The transistors $Q_1$, $Q_9$, $Q_{11}$ and $Q_{14}$ are depletion type MOS transistors, while the transistors $Q_2$, $Q_3$, $Q_4$, $Q_5$, $Q_6$, $Q_7$, $Q_8$, $Q_{10}$, $Q_{12}$ and $Q_{13}$ are enhancement type MOS transistors. The transistors $Q_6$, $Q_{12}$–$Q_{14}$ achieve characteristic portions of the present invention. In this circuit arrangement, the drain of the transistor $Q_{12}$ is connected to a node 3, and its gate is directly connected to an input A so that the transistor $Q_{12}$ may act to pull down the level at the node 3 even when a pulse having a very short width is applied to the input terminal A. In order to bring the node 3 to a low level, the transistors $Q_7$ and $Q_{12}$ are necessitated to have a predetermined dimension ratio. In other words, a mutual conductance $G_m$ of the transistor $Q_{12}$ is made larger than the transistor $Q_7$. The transistors $Q_{13}$, $Q_{14}$ and $Q_6$ form a Schmidt circuit, which effectively raises a threshold voltage of the node 2, so that the level at the node 2 is made hard to be pulled down and hard to respond to an input pulse having a minute pulse width. A mutual conductance $G_m$ of the transistor $Q_6$ is made smaller than the transistor $Q_{14}$ for obtaining a delay time at the node 5.

Figure 6:
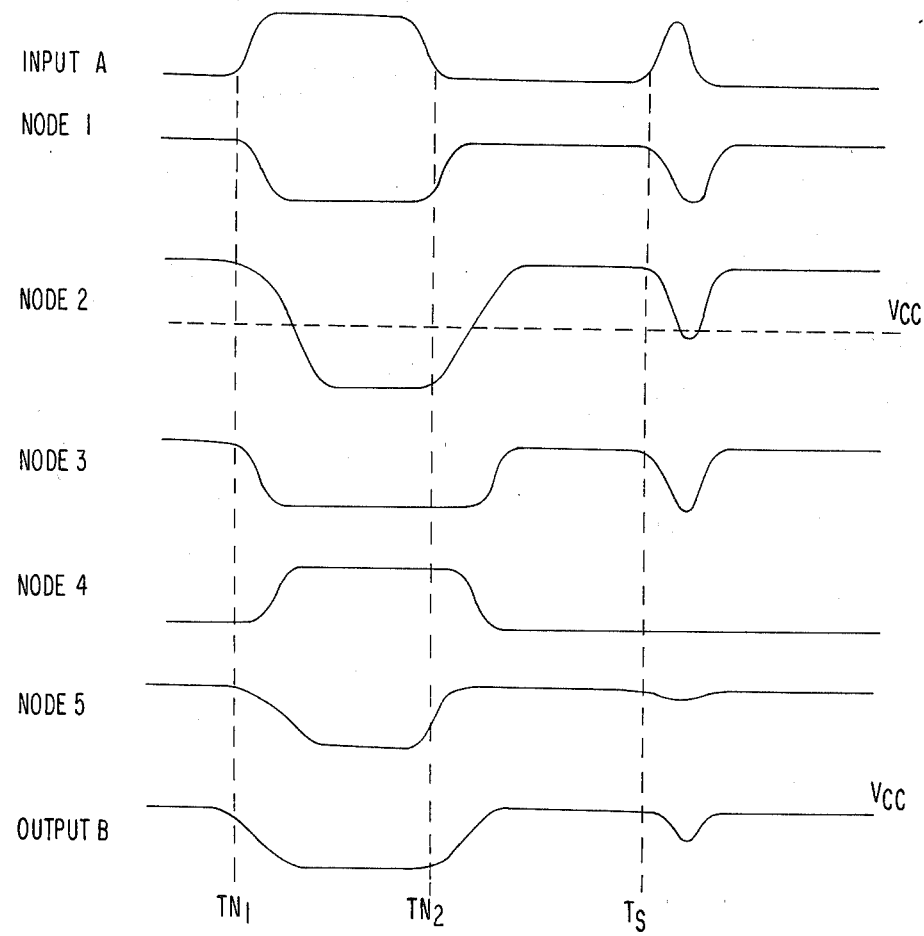

Operation waveforms appearing at various points in the circuit shown in FIG. 4, are illustrated in FIG. 6.

At a time point $TN_1$, a level at the input terminal A starts to change from a low level to a high level. Then, in response to the high level at the terminal A, the level at the nodes 1, 3 and 5 and the level of the output B are all turned to the low level respectively by the transistors $Q_2$, $Q_{12}$, $Q_6$ and $Q_4$. After a slight delay time from this, the level at the node 2 is also made the low level by the transistors $Q_{13}$ and $Q_6$. In this state, the level at the node 4 is at the high level so that the transistor $Q_8$ is conducting. A voltage across the capacitor C1 is substantially zero.

Then, at a time point $TN_2$, a level at the input A changes from the high level to the low level. In response to the level at the input A, the levels at the nodes 1, 2 and 5 are changed to the high level, while the node 3 is kept at the low level because the transistor $Q_8$ is still turned on by a delayed signal through the inverter including the transistors $Q_9$ and $Q_{10}$. In this instance, a voltage difference appears across the capacitor $C_1$ and charges it. Then, after a level at the node 4 changes to a low level, the level at the node 3 starts to rise so that the level at the node 2 is made larger than the power supply voltage ($V_{CC}$). As a result, a high level of the power supply voltage is produced at the output B.

Then, at a time point Ts, if a small, minute width of input signal is applied to the input A, then, the levels at the nodes 1 and 3 change to the low level (ground potential). While, the level at the node 2 changes not to the low level but to near the power supply voltage ($V_{CC}$) by the transistors $Q_{13}$ and $Q_{14}$. Therefore, a voltage is retained across the capacitor and the capacitor C1 is charged thereby.

As shown in FIG. 6, according to the present invention, the output B can be raised up to the power supply level even when a pulse having a very short width is applied to the input A at a time point $T_s$ because the charge of the capacitor C1 does not lose stored electric charge by such a short width signal.

Figure 5:
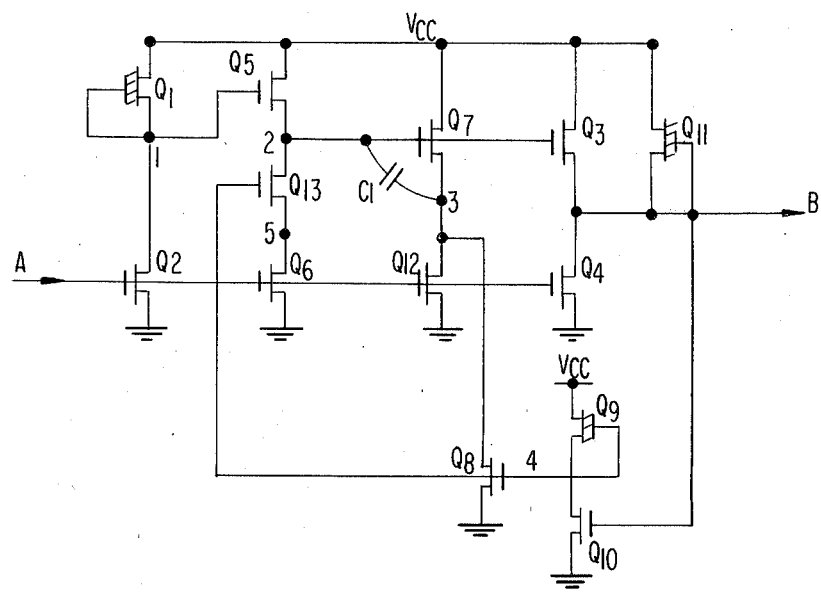

FIG. 5 shows a driver circuit for a large capacity load according to a second preferred embodiment of the present invention, in which transistors $Q_1$, $Q_4$ and $Q_{11}$ are depletion type MOS transistors, while transistors $Q_2$, $Q_3$, $Q_4$, $Q_5$, $Q_6$, $Q_7$, $Q_8$, $Q_{10}$, $Q_{12}$ and $Q_{13}$ are enhancement type transistors. Reference symbol C1 designates a boot capacitor similarly to the first preferred embodiment in FIG. 4. The gate of the transistor $Q_{13}$ is connected to a node 4 as an output of the inverter including the transistors $Q_9$ and $Q_{10}$, which inverter act as a delay circuit. That is, by providing a delay in logic at the gate input for the transistor $Q_{13}$, the level at a node 2 is made hard to be pulled down and thereby it is assured that even in response to an input pulse having a minute pulse width applied to the input terminal A, the output B can be raised up to the power supply level ($V_{CC}$).

In FIG. 4, although the level at the node 2 can be raised higher than the power supply level owing to a boot strap effect, the voltage level will be lowered as time elapses due to a leakage current at the node 2 because it is not a fixed potential. Eventually, the voltage level will settle at a potential that is lower than the power supply voltage $V_{CC}$ by one stage of threshold voltage of the transistor $Q_5$. In this case, when a signal having a minute pulse width is applied to the input terminal A, the level at the node 3 falls. In addition, since the node 2 and the node 3 are coupled through the capacitor C1, the level at the node 2 is also lowered. Then, since the level at the node 1 is at a low potential, the transistor $Q_5$ is in an OFF state, and further, since the level at the node 4 is also at a low potential, the transistor $Q_8$ is also in an OFF state. Under such a condition, if the input level at the terminal A is lowered, then the transistor $Q_{12}$ is turned OFF and the level at the node 3 rises. However, due to the above-described level lowering at the node 2, the charging voltage is insufficient, and hence the level at the node 2 cannot be raised higher than the power supply voltage.

A similar shortcoming will also arise with respect to the circuit shown in FIG. 5.

Figure 7:
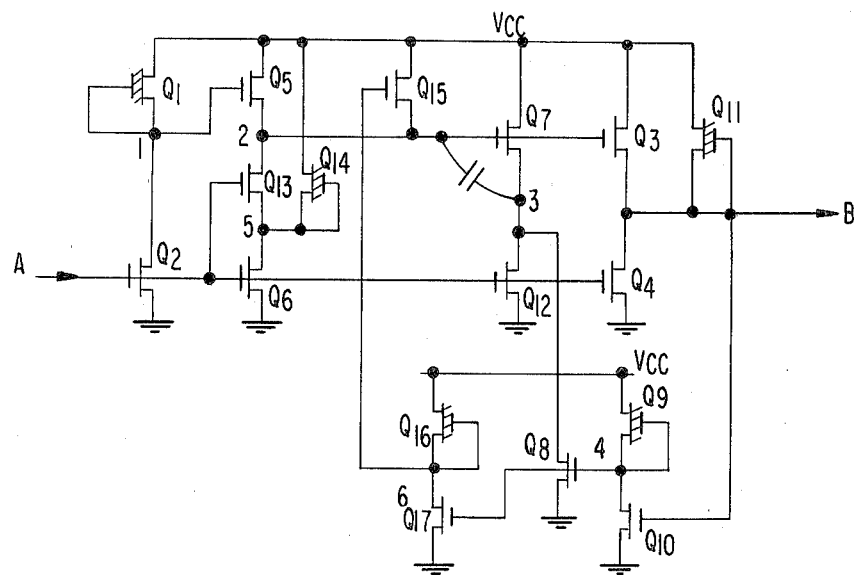
Figure 8:
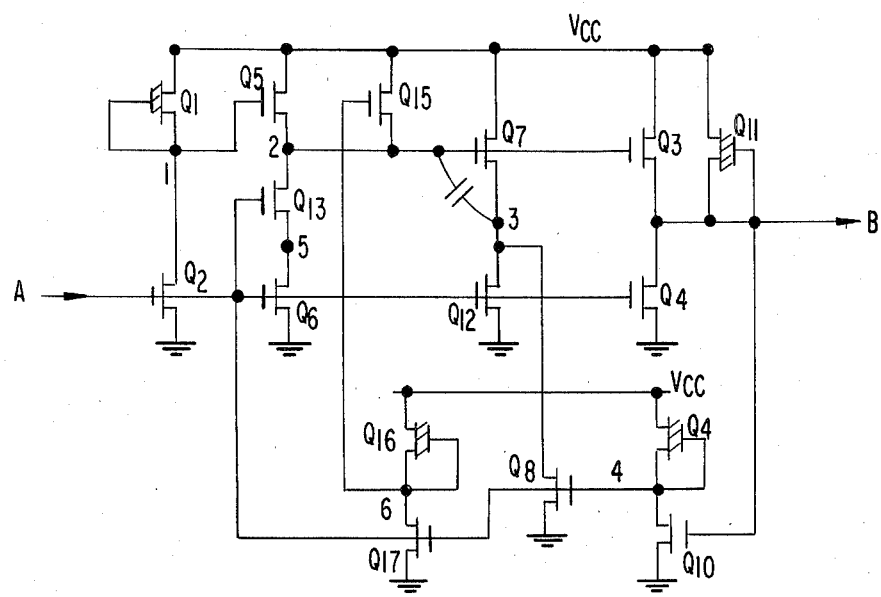

With reference to FIGS. 7 and 8, driver circuits according to third and fourth preferred embodiments, respectively, of the present invention are described, which improve the above-described shortcoming of proceeding embodiments shown in FIGS. 4 and 5.

In the preferred embodiments illustrated in FIGS. 7 and 8, respectively, an inverter consisting of transistors $Q_{16}$ and $Q_{17}$ as a delay means and another transistor $Q_{15}$ are added to the proceeding embodiments shown in FIGS. 4 and 5, respectively. In this circuit, the transistor $Q_{16}$ is a depletion type MOS transistor, while the transistors $Q_{15}$ and $Q_{17}$ are enhancement type MOS transistors. The transistors $Q_{16}$ and $Q_{17}$ form an inverter circuit and they necessitate to have a predetermined dimension ratio. Since the gate terminal of the transistor $Q_{17}$ is connected to a node 4, a node 6 responds to an input signal with a cerain time delay. Accordingly, when a pulse signal having a minute pulse width is applied to the input terminal A, the level at a node 3 is lowered. The level at the node 2 also tends to fall due to coupling through a capacitor C1. However, at the time, since the potential at the node 2 is held at the power supply level and thus the transistor $Q_{15}$ is turned ON, the level at the node 2 would not fall lower than the level that is equal to the power supply voltage $V_{CC}$ minus one stage of threshold voltage of the transistor $Q_{15}$. Under such a condition, if the input level at the terminal A is at once lowered and turns the transistor $Q_{12}$ OFF, then the level at the node 3 rises. Since the potential at the node 2 has been fully charged up, the node 2 is raised higher than the power supply voltage.

As described above, the driver circuit for a large capacity load according to the present invention has an excellent characteristic performance that the electric power consumption is small and the output can be raised always up to the power supply level despite of the input condition and regardless of the standby period prior to the driving.

Figure 9:
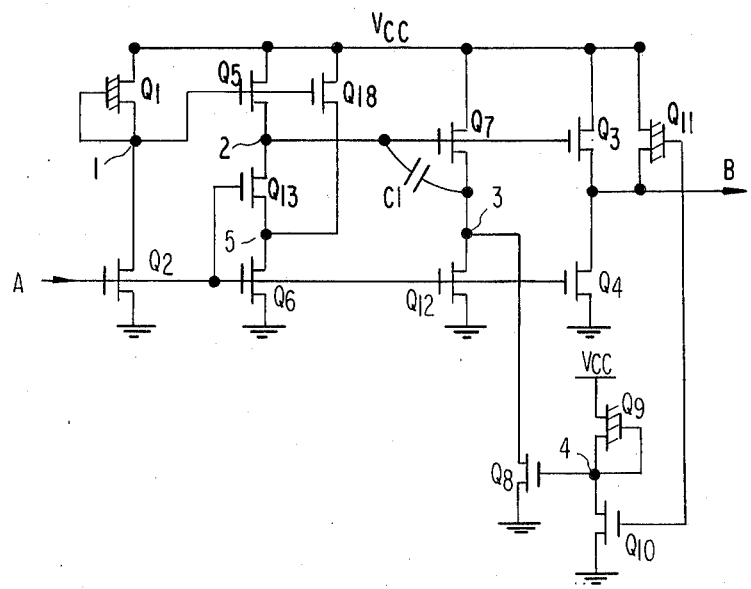

A driver circuit according to a fifth preferred embodiment of the present invention is illustrated in FIG. 9.

As shown in FIG. 9, this embodiment includes MOS transistors $Q_1$ to $Q_{13}$ and $Q_{15}$ and a bootstrap capacitor C1. The The transistors Q1, $Q_9$ and $Q_{11}$ are depletion type MOS transistors, while the transistor $Q_2$, $Q_3$, $Q_4$, $Q_5$, $Q_6$, $Q_7$, $Q_8$, $Q_{10}$, $Q_{12}$, $Q_{13}$ and $Q_{18}$ are enhancement type MOS transistors.

In this embodiment, the drain terminal of the transistor $Q_{12}$ is connected to a node 3 and its gate terminal is connected directly to the input similarly to the proceeding embodiments. When a pulse having a very short width is applied to the input A, the pulse can act to pull down the level at the node 3. In order to bring the node 3 to a low level, the transistors $Q_7$ and $Q_{12}$ are necessitated to have a predetermined dimension ratio. The transistors $Q_{11}$, $Q_{18}$ and $Q_6$ form a Schmidt circuit which effectively raises the threshold voltage, thereby makes the level at a node 2 hard to be pulled down and makes it difficult to respond to a minute pulse. The reason why the transistor $Q_{14}$ is formed of an enhancement type MOS transistor rather than a depletion type MOS transistor as in the case of FIG. 4 in this circuit arrangement, is because the former is more desirable in view of electric power consumption.

Figure 10:
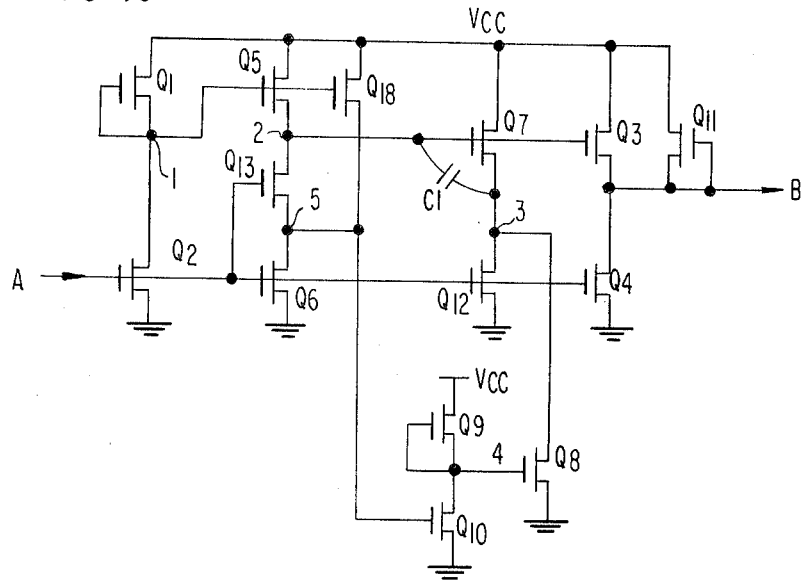

With reference to FIG. 10, a sixth embodiment of the present invention will be described.

This driver circuit includes MOS transistors $Q_1$ to $Q_{13}$ and $Q_{18}$ and a capacitor C1. The transistor $Q_1$, $Q_9$ and $Q_{11}$ are depletion type MOS transistors, while the transistors $Q_2$, $Q_3$, $Q_4$, $Q_5$, $Q_6$, $Q_7$, $Q_8$, $Q_{10}$, $Q_{12}$, $Q_{13}$ and $Q_{18}$ are enhancement type MOS transistors.

The gate terminal of the transistor $Q_{10}$ forming an inverter as a delay means is connected to a node 5, and when a level at an input terminal A has changed from a low potential to a high potential, the load at a node 5 becomes substantially large and thus delays the pull-down of the potential at the node 5, that is, the turning ON of the transistor $Q_{13}$ is delayed, so that this circuit arrangement has an advantage of making the potential at the node 2 hard to be pulled down. Since the nodes 2 and 5 are eventually lowered to the ground potential, the transistors $Q_3$ and $Q_4$ are not necessitated to have a special dimension ratio, and hence the driving capability of these transistors is strong. When a level at the input terminal A has changed from a high potential to a low potential, the transistor $Q_{13}$ is turned OFF earlier, so that the node 5 is electrically disconnected from the node 2. As a result, since the capacitance of the node 5 including the gate capacity of the transistor $Q_{10}$ becomes not to be seen from the node 2, the boot strap effect is achieved more effectively, and thus the output B can be immediately raised up to the power supply level.

In FIG. 10, though the node 2 is raised up to the power supply level owing to a boot strap effect, the voltage level will be lowered as time elapses by a leakage current at the node 2 because it is not a fixed potential. Eventually, the voltage level will settle at a potential lower than the power supply voltage $V_{CC}$ by one stage of threshold voltage of the transistor $Q_5$. At this time, if a minute pulse signal is applied to the input A, then the level at the node 3 is lowered. In addition, since the node 2 and the node 3 are coupled through the capacitor $C_1$, the level at the node 2 is also lowered. However, as the potential at the node 5 is also lowered by the discharge of electric charge through the transistor $Q_6$, the transistor $Q_{10}$ is turned OFF, and the potential at the node 4 rises. Accordingly, when the input A has changed from a high potential to a low potential, the node 2 is recharged through the transistor $Q_5$, but the potential at the node 3 is supressed to a low potential by the transistors $Q_7$ and $Q_8$ until the node 5 has been recharted through the transistor $Q_{18}$, and therefore, eventually the output B is raised up to the power supply level owing to a boot strap effect.

Figure 11:
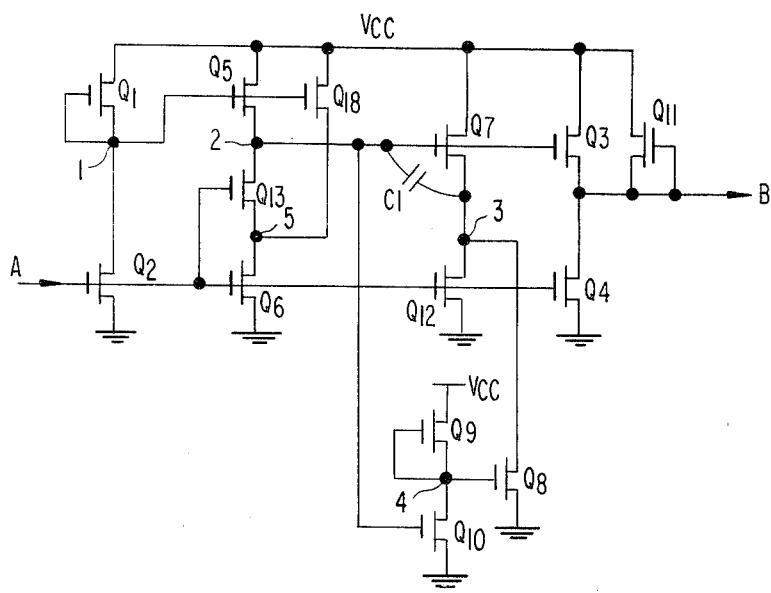

A driver circuit according to a seventh preferred embodiment of the present invention is illustrated in FIG. 11.

With reference to FIG. 11, the gate terminal of a transistor $Q_{10}$ is connected to a node 2. In this circuit arrangement, so long as the potential at the node 2 is not lowered, the transistor $Q_{10}$ is not turned OFF, and hence the transistor $Q_8$ is held in the OFF state. When a minute pulse has been applied to the input A, the potential at the node 2 is restored from the potential lowered by the coupling through the capacitor C1 again to the original potential higher than the power supply voltage so long as the electric charge on the node 2 is not lost through the transistors $Q_{13}$ and $Q_6$. Therefore, this circuit has an advantage that the output B is immediately raised up to the power supply level. However, it is to be noted that since the gate terminal of the transistor $Q_{10}$ is directly connected to the node 2, the capacity of the capacitor C1 must be selected larger than that used in the circuit shown in FIG. 10.

Figure 12:
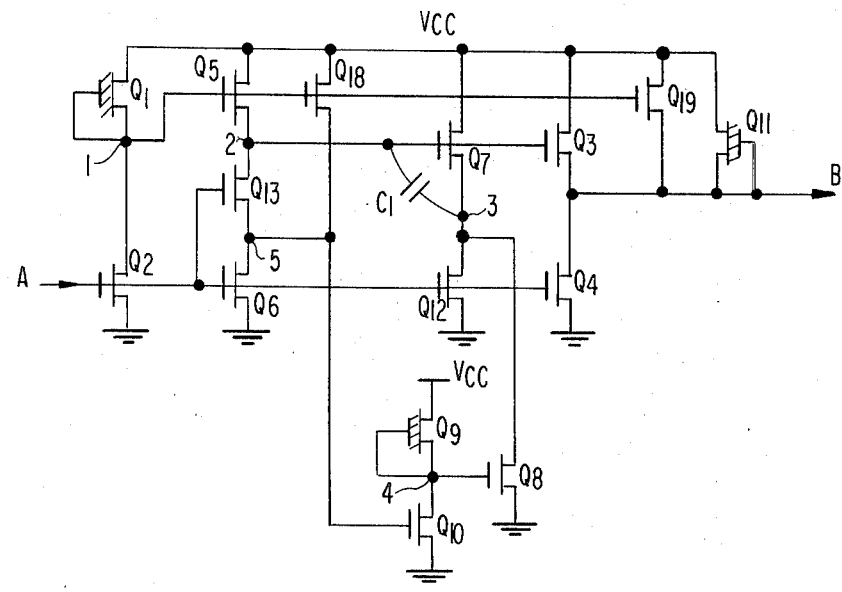

A driver circuit according to an eighth preferred embodiment of the present invention is illustrated in FIG. 12.

This circuit is a modification to the circuit shown in FIG. 10. That is, in order to speed up the rise time at an output B, a transistor $Q_{14}$ is newly added to the circuit shown in FIG. 10, the gate terminal of the transistor $Q_{19}$ is connected to a node 1, its drain terminal is connected to a power supply $V_{CC}$ and its source terminal is connected to the output B.

Figure 13:
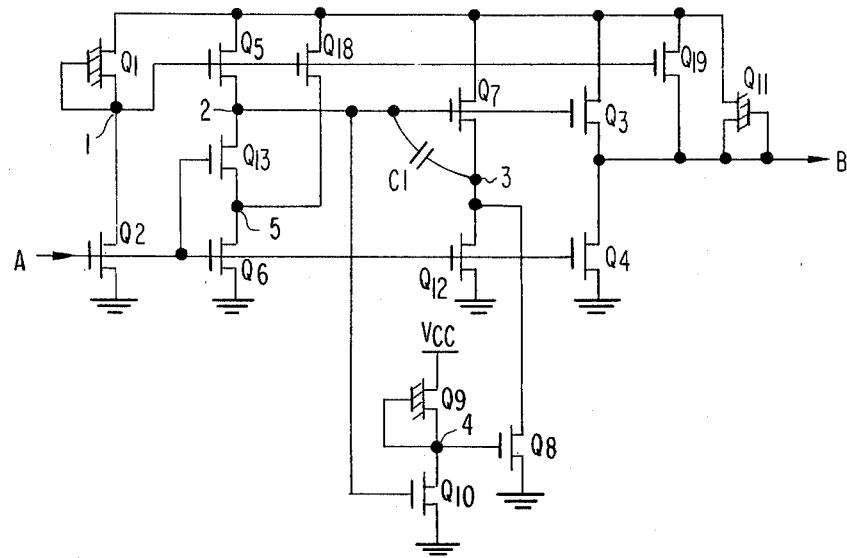

A driver circuit according to a nineth preferred embodiment of the present invention is illustrated in FIG. 13.

This circuit is a modification to the circuit shown in FIG. 11. That is, in order to speed up the rise time at an output B, a transistor $Q_{19}$ is newly added to the circuit shown in FIG. 11, and the gate, drain and source terminals of the transistor $Q_{19}$ are connected to a node 1, a power supply $V_{CC}$ and the output B, respectively, similarly to the circuit shown in FIG. 12.

I claim:

1. A circuit comprising a first insulated gate field effect transistor, a drain node of said first transistor being connectable to a drain voltage, a second insulated gate field effect transistor, a source node of said first transistor and a drain node of said second transistor being electrically common, the source node of said second transistor being connectable to a source voltage, a gate node of said first transistor being capacitively coupled to the source node thereof by a capacitance, a signal node, and a control circuit responsive to signal levels at said signal node for making said first transistor and said second transistor conducting and non-conducting, respectively, thereby producing a voltage larger than said drain voltage in absolute value at the gate node of said first transistor, said control circuit including a third insulated gate field effect transistor, having a gate for receiving a signal of substantially the same phase as a signal at said signal node and having a drain connected to the gate node of said first transistor, a fourth insulated gate field effect transistor having a gate for receiving a signal of substantially the same phase as a signal at said signal node and having a drain coupled to a source of said third transistor and a source connectable to the source voltage, a fifth insulated gate field effect transistor having a gate for receiving a signal having a phase opposite that of a signal at said signal node and having a source coupled to the gate node of said first transistor and a drain connectable to the drain voltage, whereby said fifth transistor is conducting for a first level at the signal node, and is non-conducting for the second level at the signal node, said fourth transistor is conducting in response to a second level at said signal node said third transistor is conducting after said fourth transistor becomes conducting.

2. The circuit according to claim 1, further comprising a sixth insulated gate field effect transistor having a drain connectable to the source of said first transistor and a source connectable to the source voltage and fourth means for supplying a gate of said sixth transistor with a signal delayed from the signal at said signal node.

3. The circuit according to claim 2, further comprising a output terminal and a push-pull circuit having a first input node receiving a signal from the gate node of said first transistor, a second input node receiving a signal from the gate node of said second transistor and an output node coupled to said output terminal.

4. The circuit according to claim 3, further comprising an inverter circuit having an input node coupled to said signal node and an output node coupled to the gate of said fifth transistor.

5. The circuit according to claim 4, further comprising a direct circuit connection coupled between said signal node and the gate of said fourth transistor.

6. The circuit according to claim 5, further comprising a seventh insulated gate field effect transistor having a drain connectable to the drain voltage and a source coupled to the source of said third transistor and a direct circuit connection coupled between said signal node and the gate of said fourth transistor.

7. In a circuit where an output is raised up to a power supply voltage by pulling up a gate potential of an output state transistor higher than the power supply voltage by a boot strap effect derived from one end of a capacitor, the improvement comprising a first transistor having a gate receiving a signal which is in the same phase as an input signal to the circuit and connected between the other end of said capacitor and a reference voltage source, and a series circuit including second and third transistors disposed in series between said one end of the capacitor and said reference voltage source, said third transistor having a gate for receiving a signal which has the same phase as said input signal and said second transistor having a gate for receiving a signal having substantially the same phase as said input signal, whereby a potential drop at said one end of the capacitor is reduced by said series circuit.

8. The circuit according to claim 7, in which the signal which the gate of said first transistor receives is also applied to gates of said second and third transistors.

9. The circuit according to claim 7, further comprising a fourth transistor coupled between said power supply voltage and an intermediary node of said series circuit.

10. The circuit according to claim 9, in which said fourth transistor is a depletion type insulated gate field effect transistor and a gate of said fourth transistor is connected to said intermediary node.

11. The circuit according to claim 9, in which said fourth transistor is an enhancement type insulated gate field effect transistor and a gate of said fourth transistor is provided with a signal having an opposite phase to said input signal.

12. A circuit comprising a first node, a second node, a first transistor having a gate coupled to said first node and a source coupled to said second node, capacitor means having one end coupled to said first node and the other end coupled to said second node, switching means responsive to a first level of an input signal for substantially changing a potential at said second node to a reference voltage, and control means in responsive to the first level of said input signal for substantially changing a potential at said first node to the reference voltage with a predetermined delay from a time point when said second node is changed towards the reference voltage by said switching means.

13. The circuit according to claim 12, further comprising means for connecting a drain of said first transistor to a power voltage.

14. The circuit according to claim 13, in which said switching means includes a second transistor having a drain coupled to said second node and a source supplied with the reference voltage.

15. The circuit according to claim 14, in which said control means includes a series circuit of a third and a fourth transistors.

16. The circuit according to claim 15, in which said control means further includes a circuit connection connected between a gate of said fourth transistor and a node to which said input signal is applied, and a delay circuit having an input terminal receiving a signal derived from said second node and an output terminal connected to a gate of said third transistor.

17. A circuit comprising a first terminal to which a first potential is applied, a second terminal to which a second potential is applied, a first node, a second node, an input terminal, a first insulated gate field effect transistor connected between said first terminal and said second node and having a gate connected to said first node, a capacitor coupled between said first node and said second node, second and third insulated gate field effect transistors each connected between said second node and said second terminal, a first inverter having an input node coupled to said input terminal and an output node, a fourth insulated gate field effect transistor coupled between said first terminal and said first node and having a gate coupled to the output node of said first inverter, a series circuit coupled between said first node and said second terminal, said series circuit including fifth and sixth field effect transistors connected in series, a gate of said sixth transistor being connected to said input terminal, a buffer circuit having an input node coupled to said second node and an output node, and a second inverter having an input node coupled to the output node of said buffer circuit and an output node, gates of said third and fifth transistors being connected to the output node of said second inverter, a gate of said second transistor being connected to said input terminal.

18. The circuit according to claim 17, further comprising a seventh insulated gated field effect transistor coupled between said first terminal and an intermediate junction of said fifth and sixth transistors.

19. The circuit according to claim 18, in which said buffer circuit includes eight and ninth insulated gate field effect transistors connected in series between said first and second terminals.

20. The circuit according to claim 18, further comprising a third inverter having an input node connected to the output node of said second inverter and an output node, and a tenth insulated gate field effect transistor coupled between said first terminal and said first node and having a gate coupled to the output node of said third inverter.

21. A circuit comprising a first terminal to which a first potential is applied, a second terminal to which a second potential is applied, a first node, a second node, an input terminal, a first insulated gate field effect transistor connected between said first terminal and said second node and having a gate connected to said first node, a capacitor coupled between said first node and said second node, second and third insulated gate field effect transistors each connected between said second node and said second terminal, a first inverter having an input node coupled to said input terminal and an output node, a fourth insulated gate field effect transistor coupled between said first terminal and said first node and having a gate coupled to the output node of said first inverter, a series circuit coupled between said first node and said second terminal, said series circuit including fifth and sixth field effect transistors connected in series, gates of said fifth and sixth transistors being connected to said input terminal, a buffer circuit having an input node coupled to said second node and an output node, and a second inverter having an input node coupled to the output node of said buffer circuit and an output node, a gate of said third transistor being connected to the output node of said second inverter, a gate of said second transistor being connected to said input terminal.

22. The circuit according to claim 21, further comprising a seventh insulated gate field effect transistor coupled between said first terminal and an intermediate junction of said fifth and sixth transistors.

23. The circuit according to claim 22, in which a gate of said seventh transistor is connected to the output node of said first inverter.

24. The circuit according to claim 21, further comprising an eighth insulated gate field effect transistor coupled between said first terminal and said first node, a third inverter having an input node connected to the output node of said second inverter and an output node connected to a gate of said eighth transistor.

25. A circuit comprising a first terminal to which a first potential is applied, a second terminal to which a second potential is applied, first and second insulated gate field effect transistors connected in series between said first and second terminals, a first node, a second node, a gate of said first transistor being connected to said first node, an intermediate junction of said first and second transistors being connected to said second node, said first node being capacitively coupled to said second node, a signal node, and a control circuit responsive to signal levels at said signal node for operatively producing a voltage larger than said first potential at said first node, said control circuit including third and fourth insulated gate field effect transistors connected in series between said first node and said second terminal, said fourth transistor being adapted to take a conducting state when a signal level at said signal node makes said second transistor conducting, said third transistor being adapted to take a conducting state after said fourth transistor is turned to conducting.

26. The circuit according to claim 25, further comprising a fifth insulated gate field effect transistor coupled between said first terminal and an intermediate junction of said third and fourth transistors.

* * * * *

UNITED STATES PATENT AND TRADEMARK OFFICE
CERTIFICATE OF CORRECTION

PATENT NO. : 4,395,644

DATED : July 26, 1983

INVENTOR(S) : Tetsuo Misaizu

It is certified that error appears in the above-identified patent and that said Letters Patent is hereby corrected as shown below:

olumn 1, line 53, "insulating" should be --insulated--.

Column 2, line 56, "thid" should be --third--.

Column 6, line 7, before "level" insert --low--.

Column 7, line 21, "cerain" should be --certain--.

Column 10, claim 12, line 56, "in responsive" should read -- in response --.

Signed and Sealed this

Fifth Day of June 1984

[SEAL]

Attest:

Attesting Officer

GERALD J. MOSSINGHOFF

Commissioner of Patents and Trademarks